(12) United States Patent
Fukuoka et al.

(10) Patent No.: US 10,971,278 B2
(45) Date of Patent: *Apr. 6, 2021

(54) SUPERCONDUCTING WIRE AND SUPERCONDUCTING COIL

(71) Applicant: MITSUBISHI MATERIALS CORPORATION, Tokyo (JP)

(72) Inventors: Kosei Fukuoka, Kitamoto (JP); Yuki Ito, Ageo (JP); Kazunari Maki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/091,011

(22) PCT Filed: Apr. 3, 2017

(86) PCT No.: PCT/JP2017/013929
§ 371 (c)(1),
(2) Date: Oct. 3, 2018

(87) PCT Pub. No.: WO2017/175713
PCT Pub. Date: Oct. 12, 2017

(65) Prior Publication Data
US 2019/0066865 A1    Feb. 28, 2019

(30) Foreign Application Priority Data
Apr. 6, 2016  (JP) ............................. JP2016-076900

(51) Int. Cl.
*H01B 1/02*     (2006.01)
*C22C 9/00*     (2006.01)
(Continued)

(52) U.S. Cl.
CPC ............... *H01B 1/026* (2013.01); *C22C 9/00* (2013.01); *C22F 1/08* (2013.01); *H01B 12/04* (2013.01);
(Continued)

(58) Field of Classification Search
CPC ...................................................... H01B 1/026
See application file for complete search history.

(56) References Cited

U.S. PATENT DOCUMENTS 4,233,067 A  11/1980 Sawada
4,623,862 A  11/1986 Woolf
(Continued)

FOREIGN PATENT DOCUMENTS

CN    1080779 A    1/1994
CN    1596479 A    3/2005
(Continued)

OTHER PUBLICATIONS

Chinese Office Action dated Aug. 27, 2019 for the corresponding Chinese Patent Application No. 201780008657.4.
(Continued)

*Primary Examiner* — Paul A Wartalowicz
(74) *Attorney, Agent, or Firm* — Leason Ellis LLP

(57) ABSTRACT

This superconducting wire includes: a strand including a superconducting material; and a stabilizer material for superconductor arranged in contact with the strand, wherein the stabilizer material for superconductor includes a copper material which contains one kind or two kinds or more of additive elements selected from Ca, Sr, Ba, and rare earth elements (RE) for a total amount of 3 ppm by mass or more and 400 ppm by mass or less, with the remainder being Cu and unavoidable impurities, the total concentration of the unavoidable impurities other than O, H, C, N, and S, which are gas components, is 5 ppm by mass or more and 100 ppm
(Continued)

by mass or less, and compounds including one kind or two kinds or more selected from CaS, CaSO$_4$, SrS, SrSO$_4$, BaS, BaSO$_4$, (RE)S, and (RE)$_2$SO$_2$ are present in the matrix.

5 Claims, 4 Drawing Sheets

(51) Int. Cl.
| | |
|---|---|
| H01L 39/14 | (2006.01) |
| H01F 6/06 | (2006.01) |
| C22F 1/08 | (2006.01) |
| H01B 12/08 | (2006.01) |
| H01B 12/04 | (2006.01) |
| H01B 12/16 | (2006.01) |
| H01L 39/02 | (2006.01) |
| C22F 1/00 | (2006.01) |
| H01L 39/24 | (2006.01) |

(52) U.S. Cl.
CPC .............. *H01B 12/08* (2013.01); *H01B 12/16* (2013.01); *H01F 6/06* (2013.01); *H01L 39/02* (2013.01); *H01L 39/14* (2013.01); *C22F 1/00* (2013.01); *H01L 39/2403* (2013.01); *Y02E 40/60* (2013.01)

(56) References Cited

U.S. PATENT DOCUMENTS

| | | | |
|---|---|---|---|
| 6,777,331 B2 | 8/2004 | Nguyen | |
| 8,192,596 B2 | 6/2012 | Shindo | |
| 9,234,263 B2 | 1/2016 | Kuroda | |
| 2004/0266628 A1 | 12/2004 | Lee et al. | |
| 2008/0188372 A1* | 8/2008 | Motowidlo | H01L 39/2406 505/231 |
| 2008/0223728 A1 | 9/2008 | Shindo et al. | |
| 2009/0272466 A1 | 11/2009 | Shindo et al. | |
| 2010/0163425 A1 | 7/2010 | Shindo et al. | |
| 2010/0173784 A1* | 7/2010 | Lee | H01L 39/143 505/237 |
| 2012/0028807 A1* | 2/2012 | Shinzato | H02K 3/04 505/211 |
| 2012/0100390 A1* | 4/2012 | Kuroda | C22C 1/1036 428/640 |
| 2013/0142567 A1 | 6/2013 | Sarangapani et al. | |
| 2017/0352453 A1 | 12/2017 | Fukuoka et al. | |
| 2018/0005731 A1 | 1/2018 | Fukuoka et al. | |
| 2019/0066865 A1 | 2/2019 | Fukuoka et al. | |

FOREIGN PATENT DOCUMENTS

| | | |
|---|---|---|
| CN | 1985014 A | 6/2007 |
| CN | 102453813 A | 5/2012 |
| CN | 103534370 A | 1/2014 |
| CN | 103608910 A | 2/2014 |
| CN | 105189792 A | 12/2015 |
| CN | 107002179 A | 8/2017 |
| JP | 54-097528 A | 8/1979 |
| JP | 60-062009 A | 4/1985 |
| JP | 63-065036 A | 3/1988 |
| JP | 63-140052 A | 6/1988 |
| JP | 63-235440 A | 9/1988 |
| JP | 02-145737 A | 6/1990 |
| JP | 04-224662 A | 8/1992 |
| JP | 05-025565 A | 2/1993 |
| JP | 2004-035940 A | 2/2004 |
| JP | 2006-328542 A | 12/2006 |
| JP | 2011-236484 A | 11/2011 |
| JP | 2013-049893 A | 3/2013 |
| JP | 2014-130789 A | 7/2014 |
| JP | 2016-125114 A | 7/2016 |
| JP | 2016-125115 A | 7/2016 |
| KR | 10-1079564 B1 | 11/2011 |
| TW | 201311914 A1 | 3/2013 |
| TW | 201520346 A | 6/2015 |
| TW | 201643900 A | 12/2016 |
| WO | WO-2005/073434 A | 8/2005 |
| WO | WO-2006/134724 A | 12/2006 |

OTHER PUBLICATIONS

Office Action dated Aug. 15, 2019 for the related U.S. Appl. No. 16/090,788.
International Search Report dated Jun. 27, 2017 for the corresponding PCT International Patent Application No. PCT/JP2017/013924.
International Search Report dated Jun. 27, 2017 for the corresponding PCT International Patent Application No. PCT/JP2017/013929.
Chinese Office Action dated Aug. 12, 2019 for the related Chinese Patent Application No. 201810573505.5.
Extended European Search Report dated Apr. 24, 2018 for the related European Patent Application No. 15877046.1.
Vorobieva et al., "The experimental investigation of copper for superconductors", *Physica C*, 2001, pp. 371-374, vol. 354.
International Search Report dated Mar. 8, 2016 for the related PCT Application No. PCT/JP2015/085934.
Office Action dated Aug. 2, 2016 for the related Japanese Patent Application No. 2015-001509.
Office Action dated Sep. 21, 2016 for the related Taiwanese Patent Application No. 104144247.
Office Action dated Jan. 26, 2018 for the related Chinese Patent Application No. 201580066342.6.
Office Action dated Dec. 12, 2019 for the related U.S. Appl. No. 15/539,077.
European Search Report dated Oct. 17, 2019 for the corresponding European Patent Application No. 17779091.2.
Chinese Office Action dated Sep. 4, 2019 for the corresponding Chinese Patent Application No. 201780009231.0.
Office Action dated Jun. 22, 2020 for the related U.S. Appl. No. 15/539,077.
Taiwanese Office Action dated May 25, 2020 for the corresponding Taiwanese Patent Application No. 106111408.
Notice of Allowance dated Sep. 30, 2020 for the related Chinese Patent Application No. 201780008657.4.
Korean Office Action dated Dec. 24, 2020 for the corresponding Korean Patent Application No. 10-2018-7025175.

* cited by examiner

SEM IMAGE

EDX ANALYSIS RESULT

ELECTRON DIFFRACTION PATTERN (CRYSTAL STRUCTURE: NaCl TYPE)

SEM IMAGE

EDX ANALYSIS RESULT

ELECTRON DIFFRACTION PATTERN (CRYSTAL STRUCTURE: NaCl TYPE)

SUPERCONDUCTING WIRE AND SUPERCONDUCTING COIL

CROSS-REFERENCE TO RELATED PATENT APPLICATIONS

This application is a U.S. National Phase Application under 35 U.S.C. § 371 of International Patent Application No. PCT/JP2017/013929, filed Apr. 3, 2017, and claims the benefit of Japanese Patent Application No. 2016-076900, filed Apr. 6, 2016, all of which are incorporated herein by reference in their entirety. The International Application was published in Japanese on Oct. 12, 2017 as International Publication No. WO/2017/175713 under PCT Article 21 (2).

FIELD OF THE INVENTION

The present invention relates to a superconducting wire including: a strand consisting of a superconducting material; and a stabilizer material for superconductor arranged in contact with the strand, and the present invention also relates to a superconducting coil including the superconducting wire.

BACKGROUND OF THE INVENTION

The superconducting wire described above is, for example, used in fields such as MRI, NMR, particle accelerators, maglev trains, and power storage apparatuses.

This superconducting wire has a multi-core structure in which a plurality of strands consisting of a superconducting material such as Nb—Ti or $Nb_3Sn$ are bundled with a stabilizer material for superconductor interposed therebetween. In addition, a tape-shaped superconducting wire in which a superconducting material and a stabilizer material for superconductor are laminated is also provided. In order to further improve stability and safety, a superconducting wire including a channel member consisting of pure copper is also provided.

In the superconducting wire described above, in the case when the superconducting state is destroyed in a part of the superconducting material, the resistance increases greatly at that part, and thereby, the temperature of the superconducting material increases, and there is a concern that the temperature of the entire superconducting material exceeds the critical temperature and transition to a normal conducting state occurs. Therefore, in the superconducting wire, a stabilizer material for superconductor having a comparatively low resistance such as copper is arranged so as to be in contact with the superconducting material (strands). In the case when the superconducting state is partially destroyed, the current flowing through the superconducting material is temporarily bypassed to the stabilizer material for superconductor and the superconducting material is cooled to return to the superconducting state in the meantime.

The structure of the superconducting wire consists of wire strands of the superconducting material represented by Nb—Ti or $Nb_3Sn$ and the stabilizer material for superconductor consisting of a copper material which are processed so as to be in contact with each other, and in which the plurality of strands including the superconducting material and the stabilizer material for superconductor are processed to be a single structural body. This process includes extrusion, rolling, wire drawing, drawing, and twisting.

In the stabilizer material for superconductor described above, in order to efficiently bypass the current, it is required that the resistance at extremely low temperatures be sufficiently low. Residual resistance ratio (RRR) is widely used as an indicator of electric resistance at extremely low temperatures. The residual resistance ratio (RRR) is the ratio $\rho_{293K}/\rho_{4.2K}$ of the electrical resistivity $\rho_{293K}$ at room temperature (293 K) to the electrical resistivity $\rho_{4.2K}$ at the temperature of liquid helium (4.2 K), and the higher the residual resistance ratio (RRR) is, the better the performance as a stabilizer material for superconductor is exhibited.

For example, Japanese Unexamined Publication No. H04-224662, Japanese Unexamined Publication No. 2011-236484 and Japanese Unexamined Publication No. H05-025565 propose a Cu material having a high residual resistance ratio (RRR).

Japanese Unexamined Publication No. H04-224662 discloses that a copper material having a high residual resistance ratio (RRR) is obtained by heating a copper material having a purity of 99.999% or more at temperatures of 650 to 800° C. in an inert gas atmosphere for at least 30 minutes or more. Japanese Unexamined Publication No. 2011-236484 proposes a high-purity copper having an extremely low impurity concentration in which the amounts of specific elements (Fe, P, Al, As, Sn and S) are defined.

In addition, Japanese Unexamined Publication No. H05-025565 proposes a Cu alloy in which a trace amount of Zr is added to high-purity copper having a low oxygen concentration.

It is known that the residual resistance ratio (RRR) is sufficiently high in an ultra-high purity copper where amounts of impurity elements are reduced to an extremely low level. However, there are problems in that, in order to purify copper to a high degree of purity, the production process becomes extremely complex and the production costs greatly increase.

Japanese Unexamined Publication No. H04-224662 shows a method of producing pure copper or a copper alloy having a high residual resistance ratio (RRR) using pure copper having a purity of 99.999% or more, but there is a problem in that the pure copper having a purity of 99.999% or more is used as the raw material; and thereby, the production costs greatly increases.

In addition, in Japanese Unexamined Publication No. 2011-236484, the amounts of the specific elements (Fe, P, Al, As, Sn and S) are limited to less than 0.1 ppm; however, it is not easy to reduce the amounts of these elements to less than 0.1 ppm and the problem in which the production process becomes complex remains.

Furthermore, although the amounts of oxygen and Zr are defined in Japanese Unexamined Publication No. H05-025565, there are problems in that it is difficult to control the amounts of oxygen and Zr and it is difficult to stably produce a copper alloy having a high residual resistance ratio (RRR).

Furthermore, in recent years, there has been a demand for superconducting wires including a stabilizer material for superconductor having a higher residual resistance ratio (RRR) than that in the related art.

Problems to be Solved by the Invention

The invention has been made in view of the above circumstances and the invention aims to provide a superconducting wire including a stabilizer material for superconductor, the stabilizer material for superconductor is able to be produced with a relatively simple and inexpensive production process and has a sufficiently high residual resistance ratio (RRR), and the superconducting wire is able to be used stably, and the invention also aims to provide a superconducting coil including this superconducting wire.

SUMMARY OF THE INVENTION

Solutions for Solving the Problems

The present inventors conducted extensive research in order to solve this problem; and as a result, they confirmed that, among unavoidable impurities, S, Se, and Te in particular exert an adverse influence on the residual resistance ratio (RRR). It was found that by adding small amounts of Ca, Sr, Ba, and rare earth elements (RE) to pure copper to fix S, Se, and Te as specific compounds, it became possible to produce a stabilizer material for superconductor having a high residual resistance ratio (RRR) even in the case when heat treatment is performed over a wide temperature range.

The present invention is made based on the findings described above.

There is provided a superconducting wire according to one aspect of the present invention which includes: a strand including a superconducting material; and a stabilizer material for superconductor arranged in contact with the strand, wherein the stabilizer material for superconductor includes a copper material, in which the copper material contains one kind or two kinds or more of additive elements selected from Ca, Sr, Ba, and rare earth elements (RE) for a total amount of 3 ppm by mass or more and 400 ppm by mass or less, with the remainder being Cu and unavoidable impurities, the total concentration of the unavoidable impurities other than O, H, C, N, and S, which are gas components, is 5 ppm by mass or more and 100 ppm by mass or less, and compounds including one kind or two kinds or more selected from CaS, $CaSO_4$, SrS, $SrSO_4$, BaS, $BaSO_4$, (RE)S, and $(RE)_2SO_2$ are present in the matrix.

In one aspect of the present invention, the rare earth elements (RE) are La, Ce, Pr, Nd, Pm, Sm, Eu, Gd, Tb, Dy, Ho, Er, Tm, Yb, Lu, Sc, and Y. In addition, (RE)S and $(RE)_2SO_2$ are compounds including the rare earth elements (RE) and S. The superconducting wire may include a plurality of strands including a superconducting material. The strand may consist of a superconducting material.

According to the superconducting wire having the configuration described above, the stabilizer material for superconductor includes (consists of) a copper material, and the copper material is obtained by containing one kind or two kinds or more of additive elements selected from Ca, Sr, Ba, and rare earth elements (RE) for a total amount of 3 ppm by mass or more and 400 ppm by mass or less in a copper in which the total concentration of unavoidable impurities other than O, H, C, N, and S that are gas components is 5 ppm by mass or more and 100 ppm by mass or less. Therefore, S, Se, and Te in the copper are fixed as compounds, and it is possible to improve the residual resistance ratio (RRR) of the stabilizer material for superconductor. In addition, the stabilizer material for superconductor is in electrical contact with the strand including (consisting of) a superconducting material. Therefore, even in the case when the superconducting state is destroyed in a part of the superconducting material, it is possible to bypass the current flowing through the superconducting material to the stabilizer material for superconductor, and it is possible to prevent the transition of the entire superconducting wire to the normal conducting state (propagation of the normal conducting state to the entire superconducting material), thus, it is possible to stably use the superconducting wire.

In addition, in the stabilizer material for superconductor, since the copper is used in which the total concentration of unavoidable impurities other than O, H, C, N, and S, which are gas components, is 5 ppm by mass or more and 100 ppm by mass or less, it is not necessary to excessively increase the purity of the copper, the production process is simple, and it is possible to reduce the production costs.

In one aspect of the present invention, since a compound including one kind or two kinds or more selected from CaS, $CaSO_4$, SrS, $SrSO_4$, BaS, $BaSO_4$, (RE)S, and $(RE)_2SO_2$ is present in the matrix of the stabilizer material for superconductor, the S, Se, and Te present in the copper are effectively fixed, and it is possible to improve the residual resistance ratio (RRR). In addition, since the compounds described above have high thermal stability, it is possible to stably maintain a high residual resistance ratio (RRR) even in the case when heat treatment is performed over a wide temperature range.

In one aspect of the present invention, the compounds described above also include compounds in which a part of S in CaS, $CaSO_4$, SrS, $SrSO_4$, BaS, $BaSO_4$, (RE)S, and $(RE)_2SO_2$ is substituted with Te or Se.

In the superconducting wire according to one aspect of the present invention, it is preferable that the stabilizer material for superconductor includes the copper material in which, of the unavoidable impurities, the amount of Fe is 10 ppm by mass or less, the amount of Ni is 10 ppm by mass or less, the amount of As is 5 ppm by mass or less, the amount of Ag is 50 ppm by mass or less, the amount of Sn is 4 ppm by mass or less, the amount of Sb is 4 ppm by mass or less, the amount of Pb is 6 ppm by mass or less, the amount of Bi is 2 ppm by mass or less, and the amount of P is 3 ppm by mass or less.

Among unavoidable impurities, specific impurity elements such as Fe, Ni, As, Ag, Sn, Sb, Pb, Bi, and P have an effect of decreasing the residual resistance ratio (RRR). Therefore, the amounts of these elements are defined as described above; and thereby, it is possible to effectively improve the residual resistance ratio (RRR) of the stabilizer material for superconductor.

In addition, in the superconducting wire according to one aspect of the present invention, it is preferable that the stabilizer material for superconductor includes the copper material in which a ratio Y/X of the total amount of one kind or two kinds or more of the additive elements selected from Ca, Sr, Ba, and rare earth elements (RE) (Y ppm by mass) to the total amount of S, Se, and Te (X ppm by mass) is in the range of $0.5 \leq Y/X \leq 100$.

In this case, since the ratio Y/X of the total amount of one kind or two kinds or more of the additive elements selected from Ca, Sr, Ba, and rare earth elements (RE) (Y ppm by mass) to the total amount of S, Se, and Te (X ppm by mass) is in the range described above, S, Se, and Te in the copper can be effectively fixed as compounds including one kind or two kinds or more selected from CaS, $CaSO_4$, SrS, $SrSO_4$, BaS, $BaSO_4$, (RE)S, and $(RE)_2SO_2$ and it is possible to effectively prevent decreases in the residual resistance ratio (RRR) caused by S, Se, and Te.

In addition, in the superconducting wire according to one aspect of the present invention, it is preferable that the residual resistance ratio (RRR) of the stabilizer material for superconductor is 250 or more.

In this case, since the residual resistance ratio (RRR) of the stabilizer material for superconductor is 250 or more which is relatively high, the resistance value at extremely low temperatures is sufficiently low, thus it is possible to effectively bypass the current when the superconducting state of the superconducting material is destroyed, and it is possible to prevent the normal conducting state from propagating to the entire superconducting material.

A superconducting coil according to one aspect of the present invention has a structure including a winding portion in which the superconducting wire described above is wound around a peripheral surface of a winding frame.

In the superconducting coil having this configuration, since the superconducting wire including the stabilizer material for superconductor having a high residual resistance ratio (RRR) as described above is used, it is possible to stably use the superconducting coil.

Effects of the Invention

According to one aspects of the present invention, it is possible to provide a superconducting wire including a stabilizer material for superconductor, the stabilizer material for superconductor is able to be produced with a relatively simple and inexpensive production process and has a sufficiently high residual resistance ratio (RRR), and the superconducting wire is able to be used stably, and it is also possible to provide a superconducting coil including this superconducting wire.

DETAILED DESCRIPTION OF THE INVENTION

A description will be provided below of the superconducting wire 10 according to one embodiment of the present invention with reference to the accompanying drawings.

Figure 1:
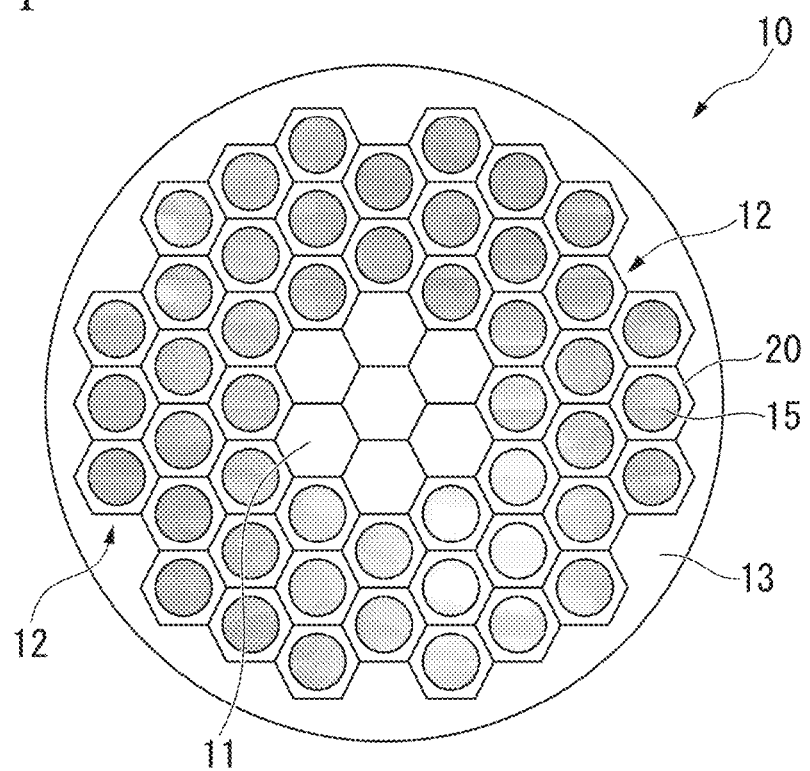
FIG. 1 is a cross-sectional schematic diagram of a superconducting wire which is one embodiment of the present invention.

As shown in FIG. 1, the superconducting wire 10 in the present embodiment includes a core portion 11, a plurality of filaments 12 arranged on the outer peripheral side of the core portion 11, and an outer shell portion 13 arranged on the outer peripheral side of the plurality of filaments 12.

Figure 2:
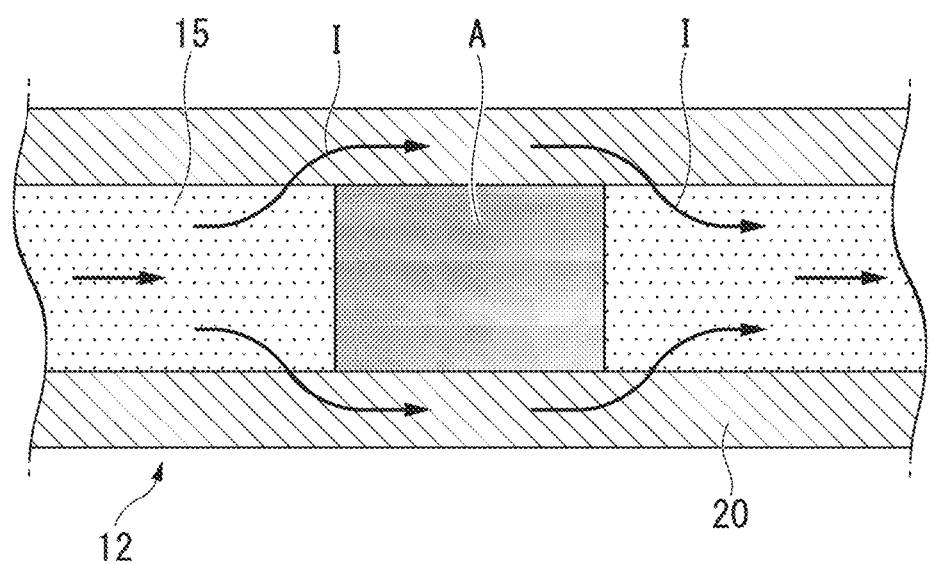
FIG. 2 is a longitudinal cross-sectional schematic diagram of a filament used for the superconducting wire shown in FIG. 1.

In the present embodiment, as shown in FIG. 1 and FIG. 2, the filament 12 described above has a structure in which a strand 15 consisting of a superconducting material is surrounded with a stabilizer material for superconductor 20 in a state of being in electrical contact therewith. In other words, the filament 12 includes the strand 15 and the stabilizer material for superconductor 20 which surrounds the strand 15 in a state of being in electrical contact with the strand 15. The strand 15 consisting of a superconducting material and the stabilizer material for superconductor 20 are in a state in which electricity can be conducted.

As shown in FIG. 2, in the case when the superconducting state is destroyed in a part of the strand 15 consisting of a superconducting material such that a normal conducting region A is generated, a current I flowing through the strand 15 consisting of a superconducting material is temporarily bypassed to the stabilizer material for superconductor 20.

The stabilizer material for superconductor 20 of the present embodiment includes a copper material, and the copper material contains one kind or two kinds or more of additive elements selected from Ca, Sr, Ba, and rare earth elements (RE) for a total amount of 3 ppm by mass or more and 400 ppm by mass or less, with the remainder being Cu and unavoidable impurities, and the total concentration of the unavoidable impurities other than O, H, C, N, and S, which are gas components, is 5 ppm by mass or more and 100 ppm by mass or less (the stabilizer material for superconductor 20 consists of the copper material).

In the present embodiment, in the copper material that constitutes the stabilizer material for superconductor 20, compounds including one kind or two kinds or more selected from $CaS$, $CaSO_4$, $SrS$, $SrSO_4$, $BaS$, $BaSO_4$, $(RE)S$, and $(RE)_2SO_2$ are present in the matrix. That is, one or more kinds selected from the above-described compounds are present in the matrix.

In the $CaS$, $CaSO_4$, $SrS$, $SrSO_4$, $BaS$, $BaSO_4$, $(RE)S$, and $(RE)_2SO_2$ described above, a part of S may be substituted with Te or Se. Since the amounts of Te and Se are smaller than the amount of S, the amount of compounds consisting of either one of Te or Se with Ca, Sr, Ba, rare earth elements (RE), or the like is small, and compounds are formed in a state where a part of S in the compounds described above is substituted with Te or Se.

In addition, in the present embodiment, in the copper material that constitutes the stabilizer material for superconductor 20, among unavoidable impurities, the amount of Fe is 10 ppm by mass or less, the amount of Ni is 10 ppm by mass or less, the amount of As is 5 ppm by mass or less, the amount of Ag is 50 ppm by mass or less, the amount of Sn is 4 ppm by mass or less, the amount of Sb is 4 ppm by mass or less, the amount of Pb is 6 ppm by mass or less, the amount of Bi is 2 ppm by mass or less, and the amount of P is 3 ppm by mass or less.

Furthermore, in the present embodiment, in the copper material that constitutes the stabilizer material for superconductor 20, a ratio Y/X of the total amount of one kind or two kinds or more of additive elements selected from Ca, Sr, Ba, and rare earth elements (RE) (Y ppm by mass) to the total amount of S, Se, and Te (X ppm by mass) is in the range of $0.5 \leq Y/X \leq 100$.

In addition, in the stabilizer material for superconductor 20 of the present embodiment, the residual resistance ratio (RRR) is 250 or more.

A description will be provided below of the reasons why the component composition, the presence or absence of the compounds, and the residual resistance ratio (RRR) of the stabilizer material for superconductor 20 are defined as described above.

(One Kind or Two Kinds or More of Additive Elements Selected from Ca, Sr, Ba, and Rare Earth Elements (RE))

Among the unavoidable impurities included in a copper, S, Se, and Te are elements which are dissolved in the copper that greatly decrease the residual resistance ratio (RRR).

Therefore, in order to improve the residual resistance ratio (RRR), it is necessary to remove the influence of S, Se, and Te.

One kind or two kinds or more of additive elements selected from Ca, Sr, Ba, and rare earth elements (RE) are elements which are highly reactive with S, Se, and Te. The additive elements described above form compounds with S, Se, and Te; and thereby, it is possible to prevent S, Se, and Te from being dissolved in the copper. Due to this, it is possible to effectively improve the residual resistance ratio (RRR) of the stabilizer material for superconductor 20.

One kind or two kinds or more of additive elements selected from Ca, Sr, Ba, and rare earth elements (RE) are elements which do not easily dissolve in a copper and which have a small effect of decreasing the residual resistance ratio (RRR) even in the case when the additive elements dissolve in the copper. For this reason, the residual resistance ratio (RRR) of the stabilizer material for superconductor 20 does not decrease greatly even in the case when the additive elements described above are added in an excessive amount with respect to the amount of S, Se, and Te.

In the case where the total amount of one kind or two kinds or more of additive elements selected from Ca, Sr, Ba, and rare earth elements (RE) is less than 3 ppm by mass, there is a concern that it will not be possible to effectively fix S, Se and Te. On the other hand, in the case where the total amount of one kind or two kinds or more of additive elements selected from Ca, Sr, Ba, and rare earth elements (RE) exceeds 400 ppm by mass, there is a concern that coarse precipitates or the like of these additive elements will be produced, which deteriorates the workability. From the above-described reasons, in the present embodiment, the total amount of one kind or two kinds or more of additive elements selected from Ca, Sr, Ba, and rare earth elements (RE) is defined to be within the range of 3 ppm by mass or more and 400 ppm by mass or less.

In order to effectively fix S, Se, and Te, the lower limit of the total amount of one kind or two kinds or more of additive elements selected from Ca, Sr, Ba, and rare earth elements (RE) is preferably 3.5 ppm by mass or more, and more preferably 4.0 ppm by mass or more. On the other hand, in order to effectively prevent decreases in workability, the upper limit of the total amount of one kind or two kinds or more of additive elements selected from Ca, Sr, Ba, and rare earth elements (RE) is preferably 300 ppm by mass or less, and more preferably 100 ppm by mass or less.

(Unavoidable Impurity Elements Other than Gas Components)

The residual resistance ratio (RRR) is improved by lowering the concentrations of unavoidable impurities other than gas components (O, H, C, N, and S). On the other hand, if the concentration of unavoidable impurities is to be reduced more than necessary, the production process becomes complex; and thereby, the production costs are drastically increased. Therefore, in the present embodiment, the total concentration of unavoidable impurities other than gas components (O, H, C, N, and S) is set to be in a range of 5 ppm by mass or more and 100 ppm by mass or less.

In order to set the total concentration of unavoidable impurities other than the gas components (O, H, C, N, and S) to be in a range of 5 ppm by mass or more and 100 ppm by mass or less, it is possible to use high-purity copper with a purity of 99 to 99.999 mass % or oxygen free copper (C10100 and C10200) as the raw material. However, in the case when the concentration of O is high, Ca, La, and Ce will react with O. Therefore, the O concentration is preferably set to 20 ppm by mass or less, and the O concentration is more preferably 10 ppm by mass or less, and most preferably 5 ppm by mass or less.

In order to effectively prevent increases in the production costs of the stabilizer material for superconductor 20, the lower limit of the unavoidable impurities other than (not including) O, H, C, N, and S, which are gas components, is preferably set to 7 ppm by mass or more, and more preferably set to more than 10 ppm by mass. In addition, in the case when O, H, C, N, and S, which are gas components, are included in the unavoidable impurities, the total concentration of unavoidable impurities including O, H, C, N and S, which are gas components, is preferably more than 10 ppm by mass, more preferably 15 ppm by mass or more, and most preferably 20 ppm by mass or more. On the other hand, in order to effectively improve the residual resistance ratio (RRR) of the stabilizer material for superconductor 20, the upper limit of the unavoidable impurities other than (not including) O, H, C, N and S, which are gas components, is preferably 90 ppm by mass or less, and more preferably 80 ppm by mass or less. In addition, it is preferable to set the upper limit of the unavoidable impurities including O, H, C, N, and S, which are gas components, to 110 ppm by mass or less.

The unavoidable impurities other than gas components in the present embodiment are Fe, Ni, As, Ag, Sn, Sb, Pb, Bi, P, Li, Be, B, F, Na, Mg, Al, Si, Cl, K, Ti, V, Cr, Mn, Nb, Co, Zn, Ga, Ge, Br, Rb, Zr, Mo, Ru, Pd, Cd, In, I, Cs, Hf, Ta, W, Re, Os, Ir, Pt, Au, Hg, Tl, Th, and U.

(Compounds Present in Matrix)

As described above, one kind or two kinds or more of additive elements selected from Ca, Sr, Ba, and rare earth elements (RE) produce compounds with the elements such as S, Se, and Te so as to prevent the elements such as S, Se, and Te from being dissolved in the copper.

Therefore, compounds (including compounds in which part of S is substituted with Te or Se) including one kind or two kinds or more selected from $CaS$, $CaSO_4$, $SrS$, $SrSO_4$, $BaS$, $BaSO_4$, $(RE)S$, and $(RE)_2SO_2$ are present in the matrix, and S, Se, and Te are fixed; and thereby, it is possible to effectively improve the residual resistance ratio (RRR).

Compounds including one kind or two kinds or more selected from $CaS$, $CaSO_4$, $SrS$, $SrSO_4$, $BaS$, $BaSO_4$, $(RE)S$, and $(RE)_2SO_2$ have high thermal stability and are able to be stably present even at high temperatures. These compounds are produced during the melting and casting process, but due to the characteristics described above, the compounds are stably present even after processing and after heat treatment. Therefore, even in the case when heat treatment is performed in a wide temperature range, S, Se, and Te are fixed as compounds, and it is possible to stably obtain a high residual resistance ratio (RRR).

In addition, compounds including one kind or two kinds or more selected from $CaS$, $CaSO_4$, $SrS$, $SrSO_4$, $BaS$, $BaSO_4$, $(RE)S$, and $(RE)_2SO_2$ are present in a number density of 0.001 particles/$\mu m^2$ or more; and thereby, it is possible to effectively improve the residual resistance ratio (RRR). In addition, in order to further improve the residual resistance ratio (RRR), it is preferable to set the number density of the compounds to 0.005 particles/$\mu m^2$ or more. The number density of the compounds is more preferably 0.007 particles/$\mu m^2$ or more. In the present embodiment, the above-described number density is applicable to compounds having a particle size of 0.1 μm or more.

In the present embodiment, since the amounts of elements such as S, Se and Te are sufficiently small, the upper limit of the number density of the compounds (particle size of 0.1

µm or more) described above is 0.1 particles/µm$^2$ or less, preferably 0.09 particles/µm$^2$ or less, and more preferably 0.08 particles/µm$^2$ or less.
(Fe, Ni, As, Ag, Sn, Sb, Pb, Bi, and P)

Among the unavoidable impurities, specific impurity elements such as Fe, Ni, As, Ag, Sn, Sb, Pb, Bi, and P have an effect of decreasing the residual resistance ratio (RRR) of the stabilizer material for superconductor 20. Therefore, the amount of each of these elements is defined; and thereby, it is possible to effectively prevent the decrease in the residual resistance ratio (RRR) of the stabilizer material for superconductor 20. Therefore, in the present embodiment, the amount of Fe is set to 10 ppm by mass or less, the amount of Ni is set to 10 ppm by mass or less, the amount of As is set to 5 ppm by mass or less, the amount of Ag is set to 50 ppm by mass or less, the amount of Sn is set to 4 ppm by mass or less, the amount of Sb is set to 4 ppm by mass or less, the amount of Pb is set to 6 ppm by mass or less, the amount of Bi is set to 2 ppm by mass or less, and the amount of P is set to 3 ppm by mass or less.

In order to more effectively prevent decreases in the residual resistance ratio (RRR) of the stabilizer material for superconductor 20, the amount of Fe is preferably set to 4.5 ppm by mass or less, the amount of Ni is preferably set to 3 ppm by mass or less, the amount of As is preferably set to 3 ppm by mass or less, the amount of Ag is preferably set to 38 ppm by mass or less, the amount of Sn is preferably set to 3 ppm by mass or less, the amount of Sb is preferably set to 1.5 ppm by mass or less, the amount of Pb is preferably set to 4.5 ppm by mass or less, the amount of Bi is preferably set to 1.5 ppm by mass or less, and the amount of P is preferably set to 1.5 ppm by mass or less. The amount of Fe is more preferably set to 3.3 ppm by mass or less, the amount of Ni is more preferably set to 2.2 ppm by mass or less, the amount of As is more preferably set to 2.2 ppm by mass or less, the amount of Ag is more preferably set to 28 ppm by mass or less, the amount of Sn is more preferably set to 2.2 ppm by mass or less, the amount of Sb is more preferably set to 1.1 ppm by mass or less, the amount of Pb is more preferably set to 3.3 ppm by mass or less, the amount of Bi is more preferably set to 1.1 ppm by mass or less, and the amount of P is more preferably set to 1.1 ppm by mass or less. The lower limits of the amounts of Fe, Ni, As, Ag, Sn, Sb, Pb, Bi, and P are 0 ppm by mass. In addition, since there is a concern that excessive reduction of the above-described amounts may result in an increase in the production costs, the amount of Fe is preferably set to 0.1 ppm by mass or more, the amount of Ni is preferably set to 0.1 ppm by mass or more, the amount of As is preferably set to 0.1 ppm by mass or more, the amount of Ag is preferably set to 0.1 ppm by mass or more, the amount of Sn is preferably set to 0.1 ppm by mass or more, the amount of Sb is preferably set to 0.1 ppm by mass or more, the amount of Pb is preferably set to 0.1 ppm by mass or more, the amount of Bi is preferably set to 0.1 ppm by mass or more, and the amount of P is preferably set to 0.1 ppm by mass or more. However, the lower limits are not limited thereto.
(Ratio Y/X of Total Amount of Additive Elements to Total Amount of S, Se, and Te)

As described above, one kind or two kinds or more of additive elements selected from Ca, Sr, Ba, and rare earth elements (RE) form compounds with elements such as S, Se, and Te. In the case where the ratio Y/X of the total amount of the additive elements (Y ppm by mass) to the total amount of S, Se, and Te (X ppm by mass) is less than 0.5, the amounts of the additive elements are insufficient, and there is a concern in that it may not be possible to effectively fix the elements such as S, Se, and Te. On the other hand, in the case where the ratio Y/X of the total amount of the additive elements to the total amount of S, Se, and Te exceeds 100, a large amount of excess additive elements which do not react with S, Se and Te may be present, and this causes a concern that the workability may be deteriorated.

From the above-described reasons, in the present embodiment, the ratio Y/X of the total amount (Y) of additive elements to the total amount (X) of S, Se, and Te is defined to be within the range of 0.5 or more and 100 or less.

In order to effectively fix the elements such as S, Se, and Te as compounds, the lower limit of the ratio Y/X of the total amount of additive elements to the total amount of S, Se, and Te is preferably 0.75 or more, and more preferably 1.0 or more. In addition, in order to effectively prevent decreases in workability, the upper limit of the ratio Y/X of the total amount of additive elements to the total amount of S, Se, and Te is preferably 75 or less, and more preferably 50 or less.

The lower limit of the total amount (X) of S, Se and Te in the stabilizer material for superconductor 20 is preferably more than 0 ppm by mass, more preferably 0.1 ppm by mass or more, even more preferably 0.5 ppm by mass or more, and most preferably 1 ppm by mass or more. The upper limit of the total amount (X) of S, Se and Te is preferably 25 ppm by mass or less, and more preferably 15 ppm by mass or less. However, the lower limit and the upper limit of the total amount (X) of S, Se and Te are not limited thereto.
(Residual Resistance Ratio (RRR))

Since the residual resistance ratio (RRR) of the stabilizer material for superconductor 20 in the present embodiment is 250 or more, the resistance value is low and it is possible to effectively bypass the current at extremely low temperatures. The residual resistance ratio (RRR) is preferably 280 or more, and more preferably 300 or more. The residual resistance ratio (RRR) is even more preferably 400 or more. The upper limit of the residual resistance ratio (RRR) is preferably 10000 or less, more preferably 5000 or less, even more preferably 3000 or less, and 2000 or less is most preferable in order to effectively prevent increases in production costs; however, the residual resistance ratio (RRR) is not limited thereto.

The stabilizer material for superconductor 20 described above is produced by a production step including a melting and casting step, a plastic working step, and a heat treatment step.

A copper wire rod having the composition shown in the present embodiment may be produced by a continuous casting and rolling method (for example, the SCR method) or the like, and the stabilizer material for superconductor 20 may be produced using this copper wire rod as a base material. In this case, the production efficiency of the stabilizer material for superconductor 20 is improved, and it is possible to greatly reduce the production costs. The continuous casting and rolling method referred thereto is a step in which a copper wire rod is produced using a continuous casting and rolling facility including a belt-wheel type continuous casting apparatus and a continuous rolling device, and a drawn copper wire is produced using this copper wire rod as a base material.

According to the superconducting wire 10 of the present embodiment having the above-described configurations, the strand 15 consisting of a superconducting material, and the stabilizer material for superconductor 20 arranged in contact with the strand 15 are included, and the stabilizer material for superconductor 20 consists of a copper material. The total concentration of unavoidable impurities other than O, H, C, N, and S, which are gas components, is set to be in a range of 5 ppm by mass or more and 100 ppm by mass or less in the copper material, and in the copper material, one kind or two kinds or more of additive elements selected from Ca, Sr, Ba, and rare earth elements (RE) are contained for a total amount of 3 ppm by mass or more and 400 ppm by mass or less. For this reason, S, Se, and Te in the copper are fixed as compounds, and it is possible to improve the residual resistance ratio (RRR) of the stabilizer material for superconductor 20.

In addition, the stabilizer material for superconductor 20 are in electrical contact with the strand 15 consisting of a superconducting material; and thereby, it is possible to effectively bypass the current to the stabilizer material for superconductor 20 even in the case when a normal conducting region A is generated in which the superconducting state is destroyed in the strand 15 consisting of a superconducting material. Therefore, it is possible to prevent the transition of the entire superconducting wire 10 to the normal conducting state, and it is possible to stably use the superconducting wire 10 according to the present embodiment.

Furthermore, since a copper is used in which the total concentration of unavoidable impurities other than O, H, C, N, and S, which are gas components, is 5 ppm by mass or more and 100 ppm by mass or less, it is not necessary to carry out excessively high purification of the copper, thus the production process is simple and it is possible to reduce the production costs of the stabilizer material for superconductor 20.

In the superconducting wire 10 of the present embodiment, compounds including one kind or two kinds or more selected from CaS, $CaSO_4$, SrS, $SrSO_4$, BaS, $BaSO_4$, (RE)S, and $(RE)_2SO_2$ are present in the matrix of the copper material that constitutes the stabilizer material for superconductor 20. For this reason, S, Se, and Te present in the copper are effectively fixed, and it is possible to improve the residual resistance ratio (RRR) of the stabilizer material for superconductor 20. In addition, since the above-described compounds have high thermal stability, it is possible to obtain the stabilizer material for superconductor 20 which has a high residual resistance ratio (RRR) in a stable manner even in the case when heat treatment is performed in a wide temperature range.

In particular, in the present embodiment, since the number density of the above-described compounds having a particle size of 0.1 μm or more is 0.001 particles/$μm^2$ or more, it is possible to effectively fix S, Se, and Te as compounds, and it is possible to effectively improve the residual resistance ratio (RRR) of the stabilizer material for superconductor 20.

Further, in the present embodiment, the amounts of Fe, Ni, As, Ag, Sn, Sb, Pb, Bi, and P which influence the residual resistance ratio (RRR) are defined such that the amount of Fe is 10 ppm by mass or less, the amount of Ni is 10 ppm by mass or less, the amount of As is 5 ppm by mass or less, the amount of Ag is 50 ppm by mass or less, the amount of Sn is 4 ppm by mass or less, the amount of Sb is 4 ppm by mass or less, the amount of Pb is 6 ppm by mass or less, the amount of Bi is 2 ppm by mass or less, and the amount of P is 3 ppm by mass or less. For this reason, it is possible to effectively improve the residual resistance ratio (RRR) of the stabilizer material for superconductor 20.

In addition, in the present embodiment, a ratio Y/X of the total amount of one kind or two kinds or more of additive elements selected from Ca, Sr, Ba, and rare earth elements (RE) (Y ppm by mass) to the total amount of S, Se, and Te (X ppm by mass) is within the range of $0.5 \leq Y/X \leq 100$. For this reason, it is possible to effectively fix S, Se, and Te in a copper as compounds with additive elements, and it is possible to effectively prevent decreases in the residual resistance ratio (RRR). In addition, a large amount of excess additive elements which do not react with S, Se and Te are not present, and it is possible to preserve the workability of the stabilizer material for superconductor 20.

In addition, in the present embodiment, since the residual resistance ratio (RRR) of the stabilizer material for superconductor 20 is 250 or more which is relatively high, the resistance value at extremely low temperatures is sufficiently low. Thus, even in the case when a normal conducting region A is generated in which the superconducting state is destroyed in the strand 15 consisting of a superconducting material, it is possible to effectively bypass the current to the stabilizer material for superconductor 20.

The superconducting coil of the present embodiment includes a winding frame and a winding portion, and the winding portion is a superconducting wire of the present embodiment wound around the peripheral surface of the winding frame.

Although the superconducting wire and the superconducting coil, which are embodiments of the present invention, are described above, the present invention is not limited thereto and is able to be appropriately modified in the range of the technical features of the invention.

For example, the core portion 11 and the outer shell portion 13 that are included in the superconducting wire 10 may also consist of a copper material having the same composition as that of the stabilizer material for superconductor 20 of the present embodiment. In such a case, the filaments 12 are arranged on the outer peripheral side of the core portion 11 in a state of being in electrical contact with the core portion 11. In addition, the outer shell portion 13 is arranged on the outer peripheral side of the filaments 12 in a state of being in electrical contact with the filaments 12. For example, the core portion 11 and the stabilizer material for superconductor 20 of the filaments 12 contacting the core portion 11 may be integrated. In addition, the outer shell portion 13 and the stabilizer material for superconductor 20 of the filaments 12 contacting the outer shell portion 13 may be integrated.

In the case when the core portion 11 and the outer shell portion 13 consist of a copper material having the same composition as that of the stabilizer material for superconductor 20 and the core portion 11 and the outer shell portion 13 are in a state of being in electrical contact with the filaments 12, the core portion 11 and the outer shell portion 13 function to exhibit the same actions as the stabilizer material for superconductor 20 in the filaments 12.

In addition, in the embodiment described above, as shown in FIG. 1, the superconducting wire 10 having a structure in which a plurality of the filaments 12 are bundled is described as an example, but the present invention is not limited thereto.

Figure 3:
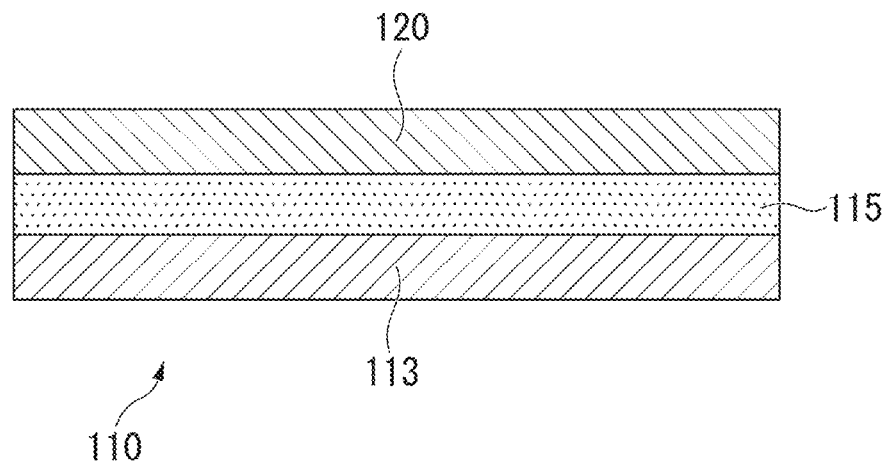
FIG. 3 is a schematic diagram of a superconducting wire which is one of other embodiments of the present invention.

For example, as shown in FIG. 3, a superconducting wire 110 having a structure in which a superconducting material 115 and a stabilizer material for superconductor 120 are laminated and arranged on a tape-like substrate 113 may be adopted. That is, the superconducting wire 110 may include a tape-like substrate 113, and a superconducting material 115 and a stabilizer material for superconductor 120 which are laminated on the substrate 113. The stabilizer material for superconductor 120 is laminated on the superconducting material 115 or surrounds the superconducting material 115 in a state of being in electrical contact with the superconducting material 115. The form (configuration) of the superconducting material 115 in FIG. 3 is a board (sheet, plate), but the form of the superconducting material 115 may be a strip, a wire, or a bar.

Figure 4:
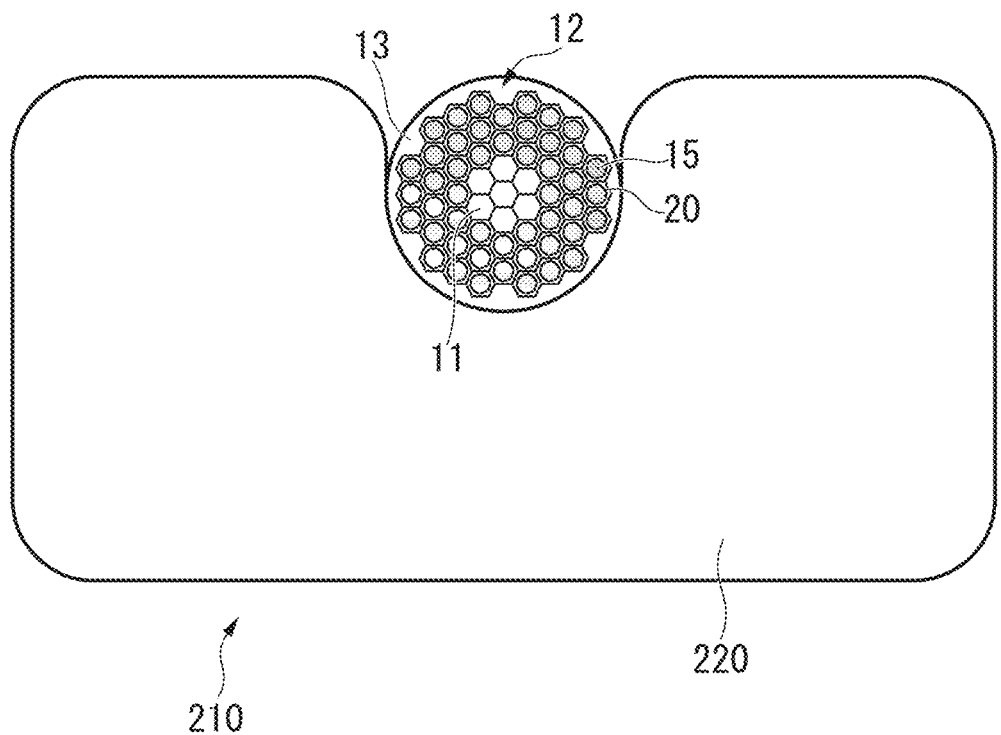
FIG. 4 is a schematic diagram of a superconducting wire which is one of other embodiments of the present invention.

Furthermore, as shown in FIG. 4, a superconducting wire 210 having a structure in which a plurality of the filaments 12 are bundled and then assembled in a channel member 220 consisting of pure copper may be adopted. That is, the superconducting wire 210 may include a channel member 220 having a recess portion and a bundle of a plurality of the filaments 12 incorporated in the recess portion. The bundle of a plurality of the filaments 12 may be, for example, the superconducting wire 10 shown in FIG. 1.

EXAMPLES

A description will be provided below of the results of confirmatory experiments conducted to confirm the effect of the present invention.

In this Example, as a laboratory experiment, high-purity copper having a purity of 99.9 mass % or more and 99.9999 mass % or less and base alloys of Ca, Sr, Ba, and rare earth elements (RE) were used as raw materials, and compositions were adjusted to obtain the values shown in Table 1. In addition, with regard to Fe, Ni, As, Ag, Sn, Sb, Pb, Bi, P, and other impurities, a base alloy of each element was prepared from Fe, Ni, As, Ag, Sn, Sb, Pb, Bi, and P having a purity of 99.9 mass % or more and pure copper having a purity of 99.99 mass %, and the composition was adjusted using the base alloys. In Invention Example 18, misch metal (MM) was added as the rare earth element (RE).

First, high-purity copper was melted in an inert gas atmosphere of Ar using an electric furnace, then various base alloys of additive elements and impurities were added thereto and the concentration of the elements were adjusted to the predetermined values, and the resultant was casted into a predetermined mold to obtain an ingot having a diameter of 65 mm and a length of 145 mm. From the ingot, a square bar having cross-sectional dimensions of 23 mm×23 mm was cut out and subjected to hot rolling at 800° C. to obtain a hot-rolled wire rod having a diameter of 8 mm. The hot-rolled wire rod was subjected to cold drawing to form a fine wire having a diameter of 2.0 mm, and the fine wire was subjected to heat treatment for 1 hour at the temperature shown in Table 2 to produce a wire for evaluation.

In this Example, it was observed that impurity elements were mixed into a copper in the process of melting and casting.

Using these wires for evaluation, the following items were evaluated.
Residual Resistance Ratio (RRR))

Using the four-terminal method, the electrical resistivity ($\rho_{293K}$) at 293K and the electrical resistivity ($\rho_{4.2K}$) at the temperature of liquid helium (4.2 K) were measured, and RRR=$\rho_{293K}/\rho_{4.2K}$ was calculated. Measurement was carried out under the condition that the distance between the terminals was 100 mm.

(Composition Analysis)

Using the sample from which the residual resistance ratio (RRR) was measured, composition analysis was carried out as follows. For elements other than gas components, glow discharge mass spectrometry was used in the case where the amount was less than 10 ppm by mass, and inductively coupled plasma emission spectrometry was used in the case where the amount was 10 ppm by mass or more. In addition, infrared absorption method was used for analyzing the amount of S. All the measured O concentrations were 10 ppm by mass or less. The infrared absorption method was used for analyzing the amount of O.

(Observation of Compound Particles)

Particles were observed using a scanning electron microscope (SEM) and energy dispersive X-ray spectroscopy (EDX) was performed. Regions in which the dispersion state of the compounds was not specific were observed at 20,000 magnification (observation visual field: 20 μm$^2$). 50 fields of view (observation visual field: 1000 μm$^2$) were imaged.

Regarding the particle size of the intermetallic compound, the average length of the major axis (the length of the longest straight line in a particle which does not come into contact with the particle edge) and the minor axis (the length of the longest straight line in the direction orthogonal to the major axis which does not come into contact with the particle edge) of the intermetallic compound was used. With regard to the compound having a particle size of 0.1 μm or more, the composition was analyzed using the energy dispersive X-ray spectroscopy (EDX) method, and it was confirmed that the compound included Ca, Sr, Ba, rare earth elements (RE), and S.

Furthermore, electron backscatter diffraction was carried out using a transmission electron microscope (TEM) to identify CaS, CaSO$_4$, SrS, SrSO$_4$, BaS, BaSO$_4$, (RE)S, and (RE)$_2$SO$_2$ compounds. Among these compounds, it was confirmed that CaS, SrS, BaS, and (RE)S had a NaCl type crystal structure, CaSO$_4$ had a CePO$_4$ type crystal structure, SrSO$_4$ and BaSO$_4$ had a BaSO$_4$ type crystal structure, and (RE)$_2$SO$_2$ had a Ce$_2$SO$_2$ type crystal structure.

In the column "Presence or absence of compounds" in Table 2, as a result of the above-described observations, a case in which the compounds of CaS, CaSO$_4$, SrS, SrSO$_4$, BaS, BaSO$_4$, (RE)S, and (RE)$_2$SO$_2$ were confirmed was evaluated as "o" and a case in which the compounds were not confirmed was evaluated as "x".

Figure 5:
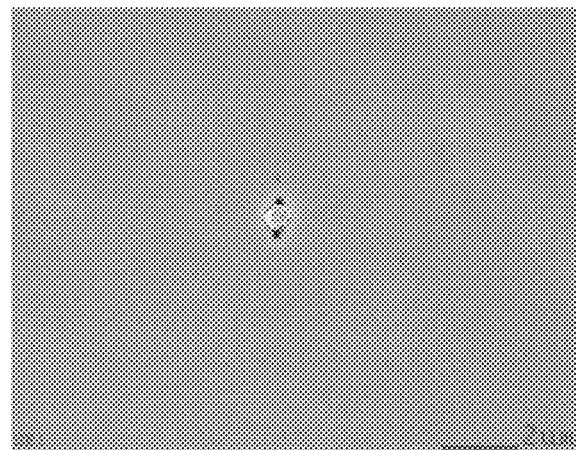
FIG. 5 is a view showing the SEM observation result, the compound analysis result, and the result of the electron backscatter diffraction of the stabilizer material for superconductor of Invention Example 4 in the Examples of the present invention.
Figure 5:
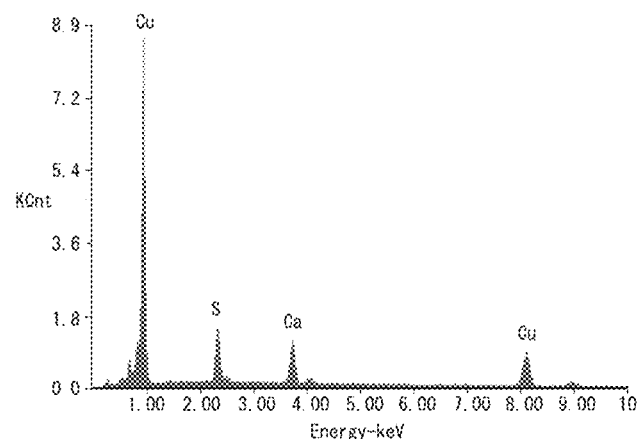
Figure 5:
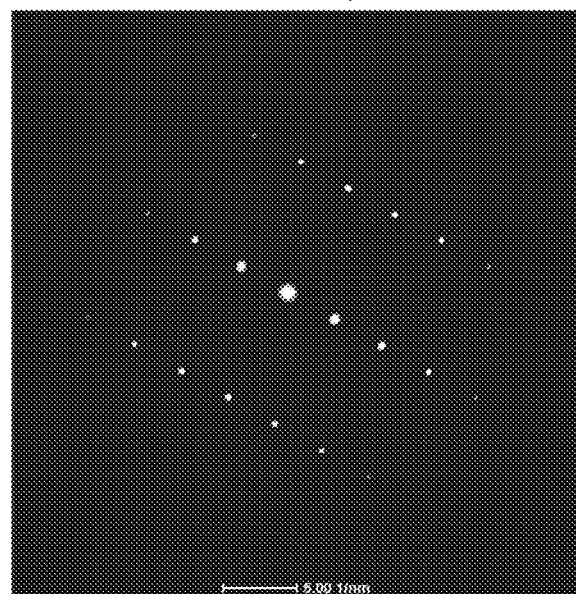
Figure 6:
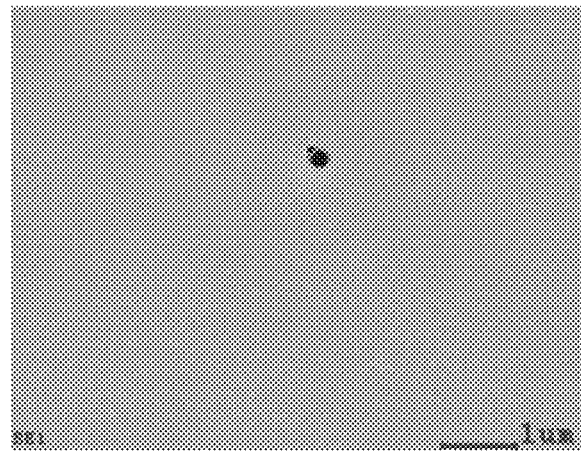
FIG. 6 is a view showing the SEM observation result, the compound analysis result, and the result of the electron backscatter diffraction of the stabilizer material for superconductor of Invention Example 10 in the Examples of the present invention.
Figure 6:
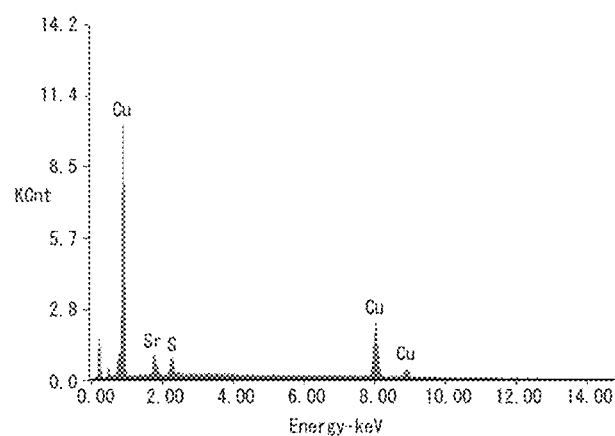
Figure 6:
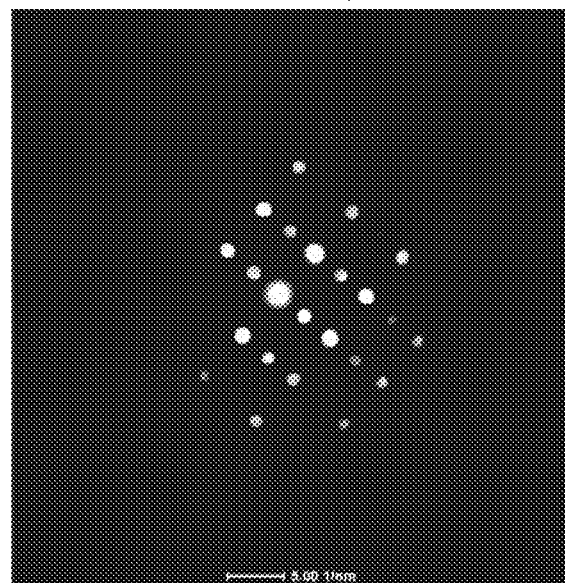

The evaluation results are shown in Table 2. In addition, the SEM observation result, the analysis result, and the electron diffraction result of the compound of Invention Example 4 are shown in FIG. 5, and the SEM observation result, the analysis result, and the electron diffraction result of the compound of Invention Example 10 are shown in FIG. 6.

TABLE 1

| | | | | | | | | Impurities (ppm by mass) | | | | |
|---|---|---|---|---|---|---|---|---|---|---|---|---|
| | | Additive Element (ppm by mass) | | | | | Total amount of unavoidable | Total amount of unavoidable | | | | |
| | | Ca | Sr | Ba | RE | Total amount Y of Ca, Sr, Ba, and RE | impurities other than O, H, C, N, and S | impurities including O, H, C, N, and S | S | Se | Te |
| Invention Examples | 1 | 3 | — | — | — | 3 | 39.3 | 42.9 | 1.6 | 2.4 | 1.2 |
| | 2 | 7 | — | — | — | 7 | 33.9 | 41.0 | 5.4 | 2.6 | 0.5 |

TABLE 1-continued

|   | | | | | | | | | | |
|---|---|---|---|---|---|---|---|---|---|---|
| 3 | 9 | — | — | — | 9 | 20.3 | 24.5 | 3.2 | 0.1 | 0.2 |
| 4 | 10 | — | — | — | 10 | 32.3 | 35.6 | 1.7 | 0.2 | 0.6 |
| 5 | 32 | — | — | — | 32 | 27.2 | 30.5 | 2.0 | 0.2 | 1.3 |
| 6 | 49 | — | — | — | 49 | 92.6 | 100.8 | 3.6 | 2.2 | 2.1 |
| 7 | 98 | — | — | — | 98 | 23.1 | 26.8 | 2.5 | 2.8 | 0.2 |
| 8 | 290 | — | — | — | 290 | 37.8 | 42.6 | 2.9 | 2.6 | 1.9 |
| 9 | 389 | — | — | — | 389 | 50.4 | 54.9 | 2.0 | 1.2 | 1.3 |
| 10 | — | 9 | — | — | 9 | 40.7 | 48.5 | 5.8 | 1.3 | 1.5 |
| 11 | — | 43 | — | — | 43 | 80.1 | 86.4 | 2.3 | 2.5 | 1.8 |
| 12 | — | 277 | — | — | 277 | 41.3 | 46.5 | 3.2 | 1.1 | 0.4 |
| 13 | — | — | 15 | — | 15 | 27.5 | 33.5 | 4.7 | 1.0 | 0.8 |
| 14 | — | — | 32 | — | 32 | 34.1 | 37.9 | 2.1 | 1.3 | 1.4 |
| 15 | — | — | 98 | — | 98 | 26.0 | 30.2 | 3.0 | 1.7 | 0.1 |
| 16 | — | — | 298 | — | 298 | 32.3 | 39.6 | 5.7 | 0.2 | 2.2 |
| 17 | — | — | — | Ce: 12 | 12 | 43.7 | 51.6 | 5.8 | 0.2 | 0.6 |
| 18 | — | — | — | MM: 35 | 35 | 30.6 | 33.8 | 1.7 | 2.4 | 1.6 |
| 19 | — | — | — | Nd: 25 | 25 | 34.2 | 38.5 | 2.6 | 2.6 | 1.6 |
| 20 | — | — | — | La: 64 | 64 | 38.4 | 44.5 | 4.2 | 0.5 | 0.8 |
| 21 | 32 | — | 22 | — | 54 | 22.5 | 25.1 | 1.5 | 0.2 | 0.9 |
| 22 | 8 | 5 | 2 | — | 15 | 21.3 | 25.2 | 2.8 | 1.3 | 1.1 |
| Comparative 1 | — | — | — | — | 0 | 87.3 | 93.4 | 1.7 | 2.5 | 1.9 |
| Examples 2 | 255 | 189 | 287 | Ce: 155 | 886 | 32.6 | 36.6 | 2.4 | 2.2 | 2.1 |

| | Impurities (ppm by mass) | | | | | | | | | | |
|---|---|---|---|---|---|---|---|---|---|---|---|
| | Total amount X of S, Se, and Te | Specific Impurities | | | | | | | | | |
| | | Fe | Ni | As | Ag | Sn | Sb | Pb | Bi | P | Cu |
| Invention 1 | 5.2 | 1.7 | 0.8 | 1.3 | 13 | 1.5 | 1.0 | 1.9 | 0.6 | 0.9 | Remainder |
| Examples 2 | 8.5 | 0.9 | 2.9 | 4.3 | 9 | 0.8 | 0.7 | 0.3 | 0.4 | 0.6 | Remainder |
| 3 | 3.5 | 0.3 | 0.9 | 0.2 | 11 | 0.2 | 0.1 | 0.3 | 0.1 | 0.1 | Remainder |
| 4 | 2.5 | 0.9 | 0.3 | 1.3 | 13 | 3.1 | 1.0 | 0.3 | 0.1 | 0.7 | Remainder |
| 5 | 3.5 | 8.8 | 1.0 | 0.1 | 4 | 0.9 | 0.7 | 0.3 | 0.1 | 0.5 | Remainder |
| 6 | 7.9 | 0.4 | 1.6 | 1.2 | 45 | 1.4 | 1.6 | 3.3 | 1.5 | 1.4 | Remainder |
| 7 | 5.5 | 1.3 | 1.2 | 0.3 | 4 | 1.8 | 0.5 | 2.1 | 0.2 | 0.7 | Remainder |
| 8 | 7.4 | 0.9 | 0.3 | 2.8 | 11 | 2.6 | 0.8 | 0.5 | 1.0 | 0.4 | Remainder |
| 9 | 4.5 | 2.2 | 1.6 | 1.7 | 18 | 0.9 | 0.3 | 5.5 | 0.6 | 0.7 | Remainder |
| 10 | 8.6 | 1.9 | 1.5 | 1.9 | 14 | 1.4 | 0.4 | 2.4 | 0.7 | 0.3 | Remainder |
| 11 | 6.6 | 0.8 | 7.0 | 0.8 | 35 | 0.4 | 1.4 | 1.2 | 1.3 | 1.2 | Remainder |
| 12 | 4.7 | 1.5 | 1.3 | 1.5 | 16 | 1.7 | 0.7 | 2.2 | 0.9 | 0.4 | Remainder |
| 13 | 6.5 | 2.1 | 1.0 | 1.7 | 7 | 1.5 | 1.3 | 0.4 | 1.0 | 0.1 | Remainder |
| 14 | 4.8 | 4.1 | 1.3 | 0.4 | 11 | 0.1 | 0.2 | 2.3 | 0.8 | 0.2 | Remainder |
| 15 | 4.8 | 1.7 | 1.0 | 1.5 | 5 | 1.0 | 0.6 | 2.5 | 1.8 | 0.1 | Remainder |
| 16 | 8.1 | 1.8 | 1.4 | 0.6 | 11 | 0.1 | 0.8 | 1.9 | 0.8 | 0.8 | Remainder |
| 17 | 6.6 | 1.0 | 0.8 | 1.9 | 18 | 1.7 | 3.1 | 1.0 | 0.1 | 0.3 | Remainder |
| 18 | 5.7 | 1.6 | 0.7 | 1.3 | 9 | 0.5 | 0.5 | 0.4 | 1.4 | 0.8 | Remainder |
| 19 | 6.8 | 2.2 | 1.0 | 0.1 | 10 | 1.1 | 0.2 | 2.6 | 0.9 | 0.9 | Remainder |
| 20 | 5.5 | 2.1 | 1.6 | 0.4 | 12 | 1.7 | 0.8 | 4.1 | 1.0 | 0.8 | Remainder |
| 21 | 2.6 | 2.5 | 1.3 | 0.2 | 5 | 0.1 | 1.0 | 1.0 | 0.5 | 2.8 | Remainder |
| 22 | 5.2 | 0.5 | 0.5 | 1.8 | 4 | 1.6 | 0.3 | 2.1 | 0.1 | 0.5 | Remainder |
| Comparative 1 | 6.1 | 4.5 | 3.5 | 2.9 | 33.0 | 3.3 | 1.4 | 2.4 | 1.1 | 1.7 | Remainder |
| Examples 2 | 6.7 | 2.8 | 1.6 | 0.9 | 7 | 1.7 | 1.0 | 1.4 | 0.7 | 0.4 | Remainder |

TABLE 2

| | | Y/X[*1] | Presence or absence of compounds[*2] | Heat treatment temperature[*3] (° C.) | RRR |
|---|---|---|---|---|---|
| Invention Examples | 1 | 0.6 | ○ | 960 | 575 |
| | 2 | 0.8 | ○ | 630 | 541 |
| | 3 | 2.6 | ○ | 810 | 1089 |
| | 4 | 4.0 | ○ | 710 | 810 |
| | 5 | 9.1 | ○ | 620 | 259 |
| | 6 | 6.2 | ○ | 790 | 567 |
| | 7 | 17.8 | ○ | 860 | 808 |
| | 8 | 39.2 | ○ | 990 | 354 |
| | 9 | 86.4 | ○ | 900 | 280 |
| | 10 | 1.0 | ○ | 600 | 595 |
| | 11 | 6.5 | ○ | 930 | 567 |
| | 12 | 58.9 | ○ | 730 | 660 |
| | 13 | 2.3 | ○ | 880 | 490 |
| | 14 | 6.7 | ○ | 780 | 301 |
| | 15 | 20.4 | ○ | 840 | 705 |
| | 16 | 36.8 | ○ | 810 | 652 |
| | 17 | 1.8 | ○ | 870 | 686 |
| | 18 | 6.1 | ○ | 710 | 655 |
| | 19 | 3.7 | ○ | 650 | 600 |
| | 20 | 11.6 | ○ | 780 | 548 |
| | 21 | 20.8 | ○ | 810 | 380 |
| | 22 | 2.9 | ○ | 880 | 936 |
| Comparative Examples | 1 | — | X | 900 | 152 |
| | 2 | 132.2 | — | — | — |

Y/X[*1]: the ratio of the total amount Y ppm by mass of additive elements to the total amount X ppm by mass of S, Se, and Te
[*2]○: Compounds including S were present, and X: Compounds including S were absent.
[*3]The final heat treatment temperature of sample In Comparative Example 1, one kind or two kinds or more of additive elements selected from Ca, Sr, Ba, and rare earth elements (RE) were not added, and, in the matrix, compounds including one kind or two kinds or more selected from CaS, CaSO$_4$, SrS, SrSO$_4$, BaS, BaSO$_4$, (RE)S, and (RE)$_2$SO$_2$ were not present and the residual resistance ratio (RRR) was 152 which was low.

In Comparative Example 2, the total amount of one kind or two kinds or more of additive elements selected from Ca, Sr, Ba, and rare earth elements (RE) was 886 ppm by mass which was more than the range of the present embodiment, and cracking occurred during plastic working. For this reason, the residual resistance ratio (RRR) was not measured and the structure was not observed.

In contrast, in Invention Examples 1 to 22, even in the case when heat treatment was performed in a wide temperature range, the residual resistance ratio (RRR) was 250 or more and it was confirmed that Invention Examples 1 to 33 were particularly suitable as a stabilizer material for superconductor.

In addition, as shown in FIG. 5, in the case when Ca was added, a compound including CaS having a NaCl type crystal structure was observed.

Furthermore, as shown in FIG. 6, in the case when Sr was added, a compound including SrS having a NaCl type crystal structure was observed.

From the above-described results, it was confirmed that according to the present invention, it is possible to provide a superconducting wire including a stabilizer material for superconductor, and the stabilizer material for superconductor is able to be produced with a relatively simple and inexpensive production process and has a sufficiently high residual resistance ratio (RRR).

INDUSTRIAL APPLICABILITY

The superconducting wire of the present invention includes a stabilizer material for superconductor, and the stabilizer material for superconductor is able to be produced with a relatively simple and inexpensive production process and has a sufficiently high residual resistance ratio (RRR). Therefore, it is possible to suitably apply the superconducting wire and superconducting coil of the present invention to MRI, NMR, particle accelerators, maglev trains, power storage apparatuses, and the like.

EXPLANATION OF REFERENCE SIGNS

10, 110, 210: superconducting wire
20, 120: stabilizer material for superconductor

The invention claimed is:

1. A superconducting wire comprising:
a strand including a superconducting material; and
a stabilizer material for superconductor arranged in contact with the strand, wherein
the stabilizer material for superconductor includes a copper material which contains one or more of additive elements selected from the group consisting of Ca, Sr, Ba, and rare earth elements (RE) in a total amount of 3 ppm by mass or more and 400 ppm by mass or less, with a remainder being Cu and unavoidable impurities,
a total concentration of the unavoidable impurities is 5 ppm by mass or more and 100 ppm by mass or less, said unavoidable impurities not including O, H, C, N, and S, which are gas components, and
one or more compounds selected from the group consisting of CaS, CaSO$_4$, SrS, SrSO$_4$, BaS, BaSO$_4$, (RE)S, and (RE)$_2$SO$_2$ are present in a matrix of the copper material.

2. The superconducting wire according to claim 1, wherein the unavoidable impurities includes:
Fe in an amount of 10 ppm by mass or less,
Ni in an amount of 10 ppm by mass or less,
As in an amount of 5 ppm by mass or less,
Ag in an amount of 50 ppm by mass or less,
Sn in an amount of 4 ppm by mass or less,
Sb in an amount of 4 ppm by mass or less,
Pb in an amount of 6 ppm by mass or less,
Bi in an amount of 2 ppm by mass or less, and
P in an amount of 3 ppm by mass or less.

3. The superconducting wire according to claim 1, wherein in the copper material, a ratio Y/X is in the range of $0.5 \leq Y/X \leq 100$, where
X (ppm by mass) is a total amount of S, Se, and Te, and
Y (ppm by mass) is a total amount of the one or more additive elements selected from the group consisting of Ca, Sr, Ba, and rare earth elements (RE).

4. The superconducting wire according to claim 1, wherein a residual resistance ratio (RRR) of the stabilizer material for superconductor is 250 or more.

5. A superconducting coil having a structure including a winding portion in which the superconducting wire according to claim 1 is wound around a peripheral surface of a winding frame.

* * * * *